United States Patent [19]
Hatsukano et al.

[11] 3,987,437
[45] Oct. 19, 1976

[54] KEY SWITCH SIGNAL MULTIPLEXER CIRCUIT

[75] Inventors: Yoshikazu Hatsukano, Kodaira; Takao Tsuiki, Kokubunji, both of Japan

[73] Assignee: Hitachi, Ltd., Japan

[22] Filed: July 26, 1973

[21] Appl. No.: 382,692

[30] Foreign Application Priority Data
July 26, 1972 Japan.............................. 47-74204

[52] U.S. Cl. ............................................. 340/365 S
[51] Int. Cl.²............................................. G08C 1/00
[58] Field of Search.......... 340/172.5, 365 S, 365 E; 445/1

[56] References Cited
UNITED STATES PATENTS

| | | | |
|---|---|---|---|
| 3,588,838 | 6/1971 | Felcheck.......................... | 340/172.5 |
| 3,624,376 | 11/1971 | Kitz.............................. | 340/365 S X |
| 3,631,403 | 12/1971 | Asbo et al........................ | 340/172.5 |
| 3,651,463 | 3/1972 | Rawson et al. ............... | 340/365 S X |
| 3,715,746 | 2/1973 | Hatano ............................ | 340/365 S |
| 3,761,918 | 9/1973 | Hatano et al.................... | 340/365 E |
| 3,900,845 | 8/1975 | Tsuiki et al. ..................... | 340/365 E |

*Primary Examiner*—Harvey E. Springborn
*Attorney, Agent, or Firm*—Craig & Antonelli

[57] ABSTRACT

A key input circuit characterized in that a plurality of keys are divided into a plurality of key blocks, that a plurality of series of timing pulses of a first group are supplied to the respective key blocks, each series of timing pulses differing in phase from each other series of timing pulses, thereby to multiplex information on the respective keys of each key block, and that the multiplexed key information from the respective blocks is further multiplexed by a plurality of series of timing pulses of a second group, the timing pulses of the second group being longer in duration than the timing pulses of the first group.

12 Claims, 6 Drawing Figures

KEY SWITCH SIGNAL MULTIPLEXER CIRCUIT

BACKGROUND OF THE INVENTION

The present invention relates to a key input circuit for use in electronic equipment or appliances, such as electronic desk calculators.

The key input circuit is used as the input circuit of an electronic desk calculator, an electronic typewriter or the like electronic equipment, and is usually composed of a plurality of push-button switches. Desired key information is inputted to the electronic equipment by sequentially manipulating the push-button switches.

FIG. 1 shows an example of a prior art key input circuit which was proposed by the present inventors. In the figure, PG designates a timing pulse generator which transmits a plurality of series of timing pulses DT1–DT10 successively shifted on phase on its respective output lines. Shown at $KB_1$ and $KB_2$ are key blocks by which groups of, for example, numeral key signals and function key signals are formed. A plurality of keys, not shown in this figure, within the key blocks $KB_1$ and $KB_2$ are respectively connected to outputs of the timing pulse generator PG. Read control circuits $RC_1$ and $RC_2$ receive outputs of the keyboards $KB_1$ and $KB_2$ as their inputs, respectively, and receive the outputs of the timing pulse generator PG as synchronization control signals. An encoder EC converts the outputs of the read control circuits $RC_1$ and $RC_2$ into, for example, combinations of signals representing binary numbers. A memory circuit M stores the outputs of the encoder EC.

IC indicates an integrated semiconductor device, part of which is constituted of the timing pulse generator PG, the read control circuits $RC_1$ and $RC_2$, the encoder EC and the memory circuit M. $P_{o1} - P_{on}$ represent output terminals of the integrated semiconductor circuit, and $P_{i1}$ and $P_{i2}$ represent input terminals thereof. The operation of the key input circuit thus constructed will be briefly explained below.

Information as to, for example, which keys in the key block $KB_1$ have been depressed is represented by timing pulses, which timing pulses are multiplexed on one line and are fed to the read control circuit $RC_1$. On the basis of the timing pulses, the read control circuit $RC_1$ distinguishes which depressed keys the multiplexed key signals correspond. The key information restored by the read control circuits $RC_1$ and $RC_2$ in this way are coded into binary numbers by the encoder EC. The coded key information is stored in the memory circuit M.

According to the key input circuit thus described, the number of the input terminals $P_{i1}$ and $P_{i2}$ from the keys to the integrated semiconductor circuit IC can be made remarkably smaller as compared with the number of keys.

Here, if the number of timing pulse series is increased a larger number of key information signals can be multiplexed. That is, since a timing pulse must be applied to each key in the system of the type disclosed in FIG. 1, in order to increase the number of keys it was previously required to increase the number of timing pulses in each series. The timing pulses, however, are not exclusively used for the key input circuit, but are mainly used as indication digit switching signals in the case of performing dynamic indication in an associated display device, for example, as seen in U.S. Pat. No. 3,715,746. When the number of timing pulse series is increased only for use in the key input circuit, the number of timing pulses employed becomes larger than the number of indication digits. Thus, if the number of timing signals exceeds the number of indicator lamps in the display device, it might be necessary to control the number of indicator lamps by more than one timing signal or to control the respective lamps by nonconsecutive timing singals, either of which conditions would result in a flickering of the display lamp. As a result, the indication is intermittently effected, and it becomes extremely unstable and produces a flickering appearance to the eyes. Accordingly, it is also undesirable from the aspect of arithmetic control if the number of timing pulse series is increased only for the purpose of multiplexing a larger number of key information signals. Further, when the number of timing pulse series is increased, the number of the external output terminals $P_{ol} - P_{on}$ of the integrated circuit must be increased on account of the necessity for supplying a different series of timing pulses to each of the keys. However, it is extremely difficult to increase the number of terminals in an integrated circuit.

In this respect, with the circuit shown in FIG. 1, a plurality of keys are classified into relatively few key blocks, and the read control circuits are connected to the respective blocks, whereby a large number of key information signals are represented with a small number of timing pulse series.

SUMMARY OF THE INVENTION

The present invention intends to further improve the key input circuit as stated above.

An object of the present invention is to provide a key input circuit which can easily increase the number of keys without increasing the size and complexity of the read control circuit which is already composed of a large number of gate circuits.

Another object of the present invention is to provide a key input circuit which can generate a number of key information signals without adding to the number of timing pulses and having a small number of timing pulses.

Another object of the present invention is to provide a key input circuit which reduces the number of input terminals from key blocks to an integrated circuit by substituting a plurality of timing pulses for the information of a key.

DESCRIPTION OF THE PREFERRED EMBODIMENT

An embodiment of the key input circuit according to the present invention will be described in detail hereunder with reference to the accompanying drawings.

Figures 2, 6:
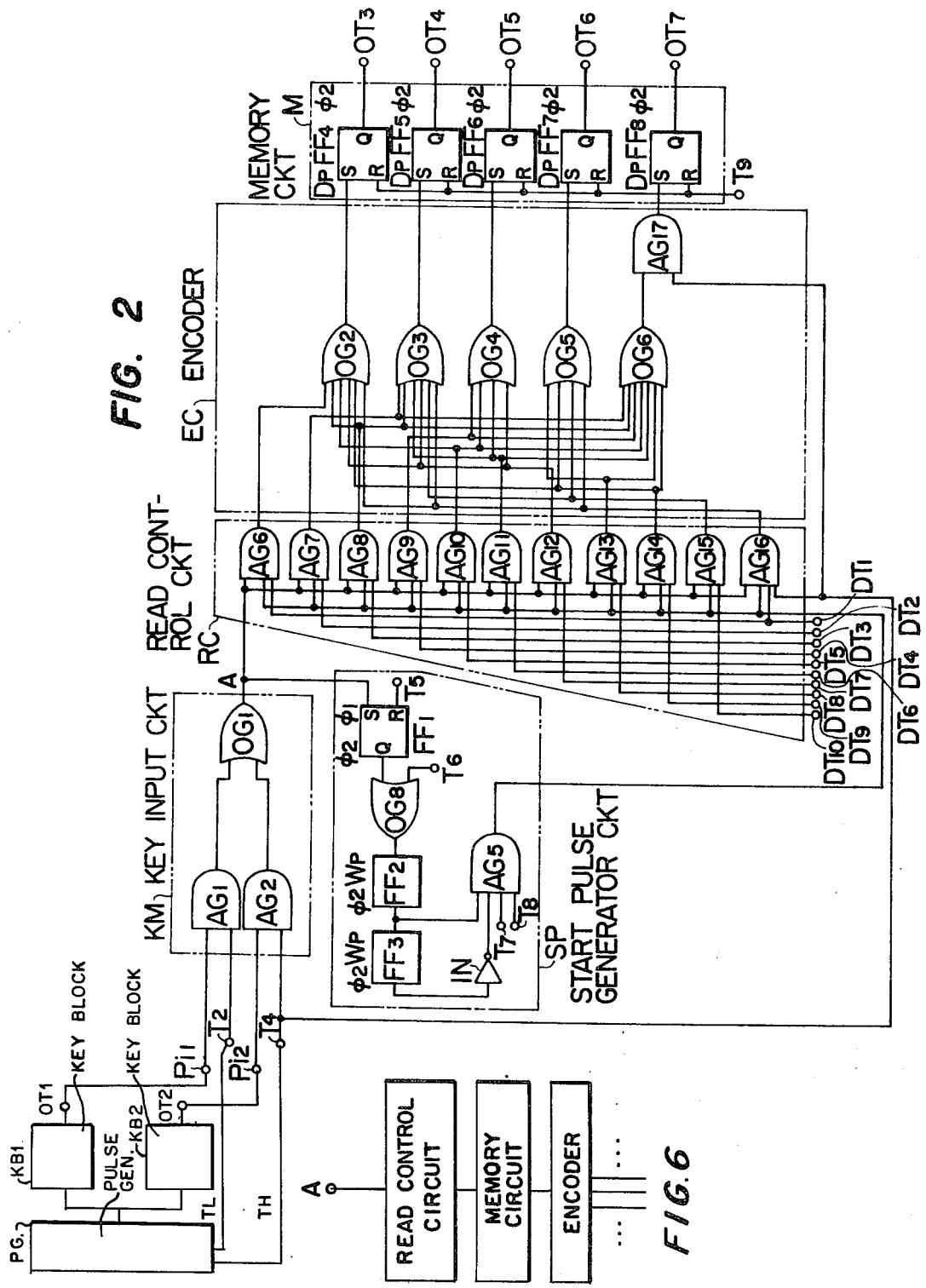
FIG. 2 is a circuit diagram showing an embodiment of a key input circuit according to the present invention.
FIG. 6 is a schematic block diagram of an alternate embodiment of he key input circuit of the present invention.

FIG. 2 is a circuit diagram showing the embodiment of the key input circuit according to the present invention. In the figure, $P_{i1}$ and $P_{i2}$ designate external input terminals of an integrated semiconductor circuit, part of which is constituted of a key input multiplexor circuit KM, a start pulse generator circuit SP, a read control circuit RC, an encoder EC and a memory circuit M as will be hereinafter described. Each of AND gates $AG_1$ and $AG_2$ has a multiplexed key signal supplied through the terminal $P_{i1}$ or $P_{i2}$ to one of its input terminals. To the other input terminals of the AND gates $AG_1$ and $AG_2$ are applied respective timing pulses TL and TH shown in FIG. 4 from timing pulse generator PG. An OR gate $OG_1$ receives outputs of the AND gates $AG_1$ and $AG_2$ as its inputs. These gate circuits constitute the key signal multiplexing portion KM. The external input terminals $P_{i1}$ and $P_{i2}$ are respectively connected to an output terminal $OT_1$ of a numeral key block $KB_1$ and an output terminal $OT_2$ of a function key block $KB_2$ shown in detail in FIG. 3, both the key blocks receiving as their inputs series of digit pulses $DT_1 - DT_{10}$ which form a first group of timing pulses (refer to FIG. 4), which are supplied from the timing pulse generator P.G. As stated above, the terminals $T_2$ and $T_4$ are supplied with a second group of timing pulses in the form of respective series of sector pulses TL and TH which, as shown in FIG. 4, are provided on the basis of the digit signal $DT_1$ and are opposite in phase to each other. In FIG. 4, the upper level of each signal represents the logic 1, and the lower level the logic 0.

In FIG. 2 a flip-flop circuit $FF_1$ is set by an output of the key signal multiplexing portion KM. The flip-flop circuit $FF_1$ is reset by a timing pulse $TH \cdot DT_{10} \cdot BT_4$, which is supplied to a terminal $T_5$ and which is made on the basis of the sector pulse TH, the digit pulse $DT_{10}$ and a bit pulse $BT_4$ provided by the pulse generator circuit PG. An OR gate $OG_8$ receives as its inputs an output of the flip-flop circuit $FF_1$ and an auto-clear signal supplied to a terminal $T_6$. Flip-flop circuits $FF_2$ and $FF_3$ are connected in cascade to the output terminal of the OR gate $OG_8$. An inverter IN is connected to the output end of the flip-flop circuit $FF_3$, and an AND gate $AG_5$ receives as its inputs an output signal of the flip-flop circuit $FF_2$, an output signal of the inverter IN and signals fed to terminals $T_7$ and $T_8$. These components $FF_1$, $OG_8$, $FF_2$, $FF_3$, IN and $AG_5$ form the start pulse generator circuit SP. The signals supplied to the input terminals $T_7$ and $T_8$ of the AND gate $AG_5$ serve as key input blocking signals during overflow and operation, respectively. Although not shown, the signals applied to terminals $T_6$, $T_7$ and $T_8$ are conventional calculator control signals derived from other portions of the calculator.

$AG_6 - AG_{16}$ indicate AND gates each of which receives as its inputs the output of the key signal multiplexing portion KM, an output of the start pulse generator circuit SP and the a corresponding one of the plural series of digit pulses $DT_1 - DT_{10}$. The gates $AG_6 - AG_{16}$ constitute the key signal reading circuit RC.

The encoder EC receives outputs of the AND gates $AG_6 - AG_{16}$ of the key signal reading circuit as its inputs, and converts them into a parallel binary-coded signal of 5 bits. It is composed of five OR gates $OG_2 - OG_6$. The AND gate $AG_{16}$ is additionally supplied with the timing pulse series TH as a control input signal. An AND gate $AG_{17}$ receives as its inputs an output of the OR gate $OG_6$ and the sector pulse series TH. Flip-flop circuits $FF_4 - FF_8$ are set by outputs of the OR gates $OG_2 - OG_5$ and an output of the AND gate $AG_{17}$, respectively. The flip-flop circuits $FF_4 - FF_8$ form the memory M. Outputs $OT_3 - OT_7$ of the respective flip-flops $FF_4 - FF_8$ are connected to an arithmetic circuit (not shown). As reset inputs R of the flip-flop circuits $FF_4 - FF_8$, there are provided the output signal of the start pulse generator circuit SP and a clear signal.

The operation of the key input circuits thus constructed will now be explained.

1. Key Blocks $KB_1$ and $KB_2$

Figures 3, 5:
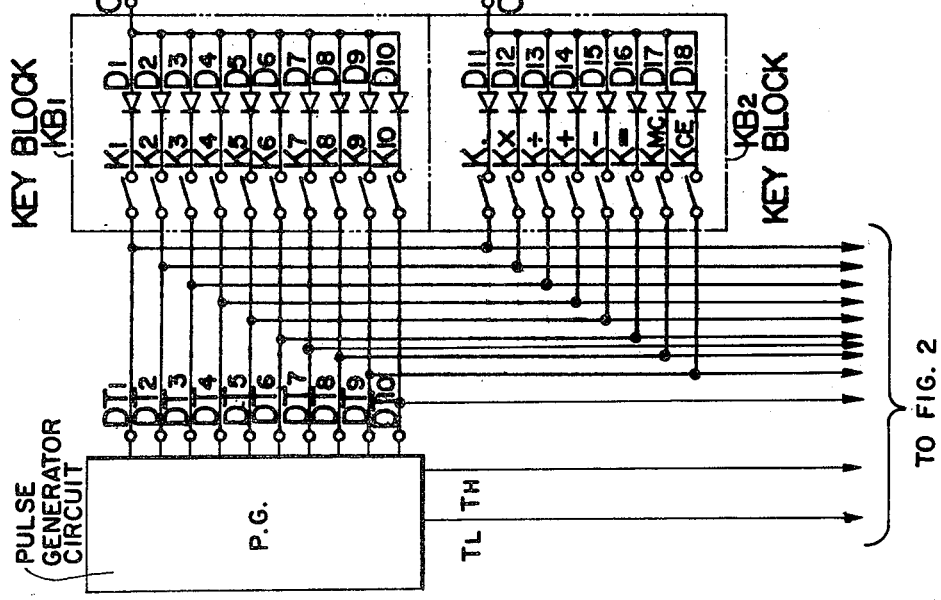
FIG. 3 is a circuit diagram of key switches to be connected on the input side of the circuit shown in FIG. 2.
FIG. 5 is a table listing the relations between key information and output signals.
Figure 4:
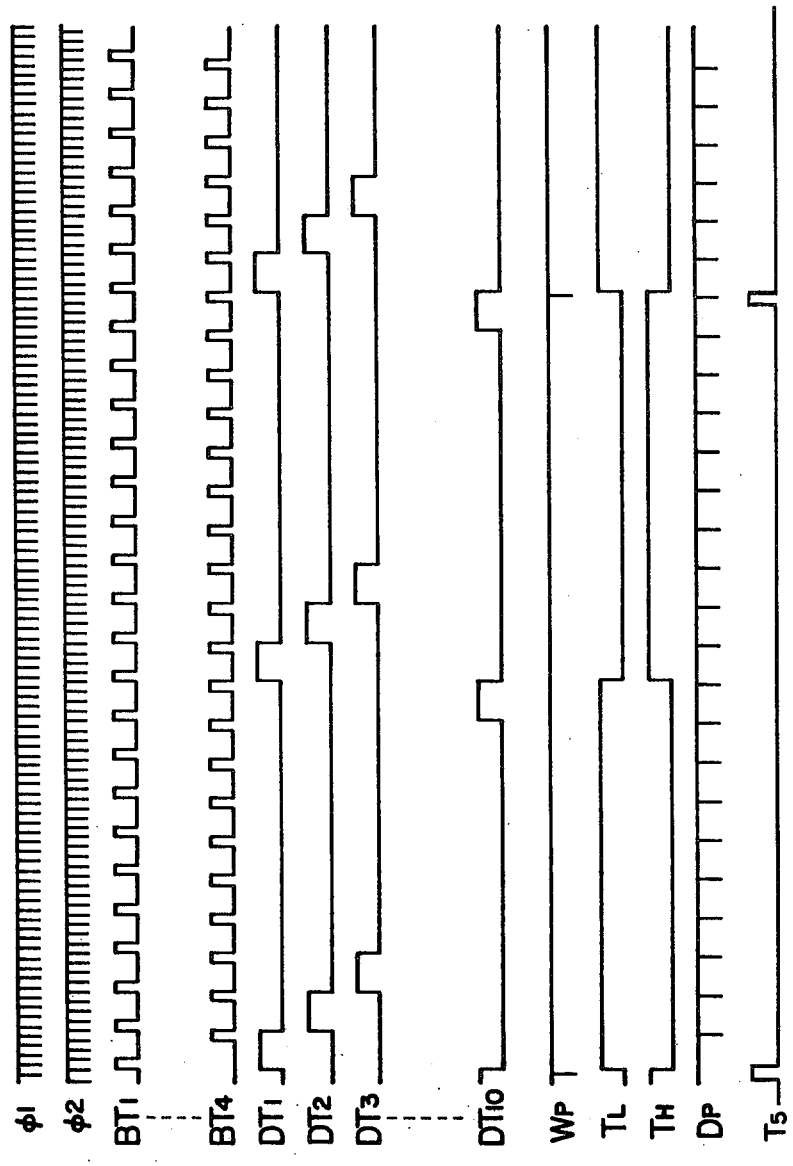
FIG. 4 is a waveform diagram of pulse signals derived from a pulse generator for use in the key input circuit shown in FIG. 2.

The respective series of sequential timing pulses $DT_1 - DT_{10}$ are fed to the left terminals of the respective keys of the key block $KB_1$, as seen in FIG. 3. Then, when any key is closed, the timing pulses fed to the closed key appear at the output terminal $OT_1$ of the key block $KB_1$. For example, when the numeral key $K_5$ is closed, the timing pulses of the series $DT_5$ appear at the output terminal $OT_1$.

Similarly, when any key of the key block $KB_2$ is closed, the sequential timing pulses of the series supplied to the closed key appear at the output terminal $OT_2$.

Accordingly, information as to which keys have been closed represented by the respective series of timing pulses $DT_1 - DT_{10}$ appearing at the terminals $OT_1$ or $OT_2$. The information is united into the one output in each key block (multiplexed). The key signal thus multiplexed becomes an input signal of the key signal multiplexor circuit KM as explained below.

While the key blocks $KB_1$ and $KB_2$ are shown in FIG. 3 to comprise groups of ten switches and eight switches, respectively, the key blocks are not restricted to any particular number of switches. Thus, the group of switches in each key block may comprise an equal number of switches or a different number of switches may be provided in each group as illustrated.

2. Key Signal Multiplexor Circuit KM

The AND circuits $AG_1$ and $AG_2$ receive as control signals one of the series of timing pulses TL and TH, respectively. When the timing pulses of the respective series TL and TH become 1, the gates of the respective AND circuits are opened. The OR circuit $OG_1$ functions to combine the signals which are controlled by the timing pulses TL and TH in this manner.

Accordingly, the key signal generated in the key block $KB_1$ can pass through the key signal multiplexing circuit KM only when a timing pulse of the series TL is at level 1. The key signal produced in the keyblock $KB_2$ can pass through the circuit KM only when a timing pulse of the series TH is at level 1.

In summary, the key signal multiplexing circuit KM functions so that the key signals multiplexed by the key blocks $KB_1$ and $KB_2$ may be distinguished therebetween in time and so that they may be further multiplexed. Thus far, the information of the respective keys are converted into timing pulses of logical expressions, as illustrated in FIG. 5.

3. Start Pulse Generator Circuit SP

A detailed explanation of the operation will be omitted, and only essential points will be described. The start pulse generator circuit SP separates a start pulse signal for determining the period in which the key signal is read out.

For Example, in the case where the numeral key $K_3$ is kept depressed, timing pulses of $DT_3 \cdot TL$ appear on the output side of the key input signal multiplexing circuit KM during such period. If a pulse signal corresponding thereto is indefinitely fed into, for example, a register of the calculator, the contents of all the digits of the register will become 3. The start pulse signal prescribes the read period for the key signal so as to avoid such inconvenience, and is generated for every depression of a key.

The start pulse signal is employed as a control signal of the read control circuit RC and the memory circuit M hereinbelow described.

4. Read Control Circuit RC

Each time the start pulse is generated, the AND circuits $AG_6 - AG_{15}$ of the read control circuit RC detect what key signals are contained in the multiplexed key signal fed from the key signal multiplexing circuit KM. For example, when the output of the AND circuit $AG_7$ becomes 1, it is made known that the numeral key $K_2$ or function key $K_x$ has been closed.

The AND circuit $AG_{16}$ is especially provided in the embodiment. It detects whether or not the timing pulse $DT_1 \cdot TH$ is included in the multiplexed key signal, namely, whether or not a decimal point key K. has been depressed. This is intentionally provided to dispose, for convenience' sake, the decimal point key K. along with the numeral keys $K_1 - K_0$ by considering it as being separate from the function keys.

5. Encoder EC

The encoder EC codes into binary numbers the key signals which have been detected and converted into the timing pulses $DT_1 - DT_{10}$ by the read control circuit RC. For example, the key signal converted into the timing pulse $DT_2$ is coded to the fourth bit of numbers into 0010 by the OR circuits (in the output sequence from the OR circuit $OG_5$ to the OR circuit $OG_2$).

Here, the output stage of the encoder EC at the fifth bit of the numbers, namely, the AND circuit $AG_{17}$ discriminates between the key signals of the numeral key block $KB_1$ and the function key block $KB_2$. More specifically, the AND circuit $AG_{17}$ opens its gate only when the timing pulse TH is 1, and does not open its gate when the timing pulse TL is 1. Therefore, the output 1 of the AND circuit $AG_{17}$ makes known that a key included in the numeral key block $KB_1$ has been depressed, while the output 0 makes known that a key located in the function key block $KB_2$ has been depressed. Accordingly, by way of example, when the numeral key $K_2$ is depressed, the output of the encoder becomes 00010. When the function key $K_x$ is depressed, it becomes 10010.

The above relations are listed in FIG. 5.

6. Memory circuit M

The key signals thus derived from the encoder EC differ in phase in dependence on the depressed keys, so that the phases need to be made uniform. The memory circuit M is employed for such purpose, namely to store the outputs of the encoder EC.

When it is necessary to clear the contents of the whole calculator, when a key has been erroneously depressed, and when a key is to be depressed anew, the memory circuit M must eliminate key signals already stored therein. To this end, a clear signal from other portions of the calculator and the start pulse signal from the start pulse generator circuit SP are used as the reset input of the memory circuit M.

The relations between the key information and the output signals in the circuit thus constructed, are tabulated as illustrated in FIG. 5.

Although, in the foregoing embodiment, description has been made of the case where the output of the encoder EC is stored in the memory M, the present invention is not restricted to the exemplified case. Even when the memory is arranged between the read control portion RC and the encoder EC, as seen in FIG. 6, a similar effect is achieved.

Although, in the embodiment, description has been made of the case where the two key blocks consisting of the numeral setting key block and the function key block are employed, the invention is not restricted thereto, and three or more key blocks can be used.

As described above, the key input circuit according to the present invention is so constructed that key signals are multiplexed by timing pulses (digit pulses), while outputs of a key block unit divided into blocks of numeral setting keys, function keys, etc., are multiplexed by timing pulses longer in period than the first-mentioned timing pulses. Therefore, the number of input pins to the integrated circuit can be made remarkably small relative to the number of keys. In addition, the number of timing pulses in each series can be made small relative to the number of keys.

Figure 1:
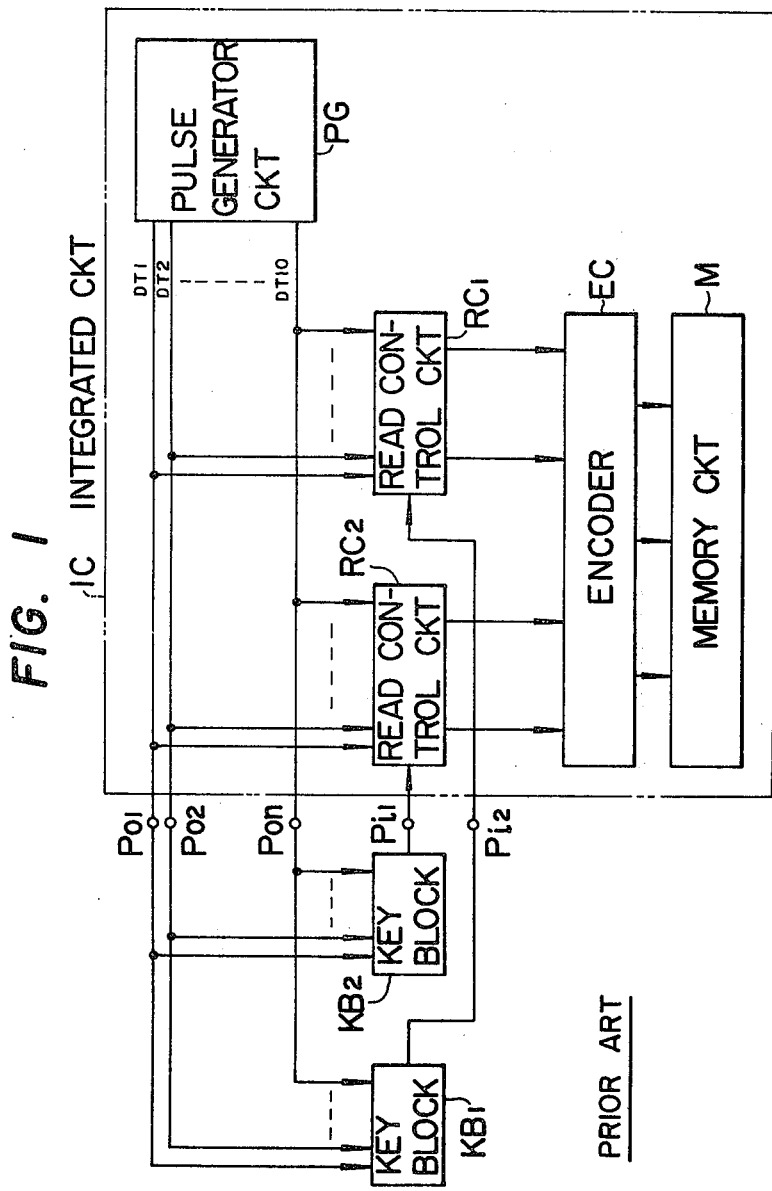
FIG. 1 is a circuit diagram showing an example of a key input circuit of the prior art.

In the keys input circuit in FIG. 1, the read control portion composed of a number of gate circuits is required for each key block. Since, in contrast, the key input circuit according to the present invention requires only the single read control portion, it can be brought into an extremely simple construction.

What is claimed is:

1. A key input circuit comprising a plurality of key blocks each including a plurality of keys, timing pulse generator means for generating a plurality of series of sequential timing pulses of different phase connected respective to said key blocks so that each timing pulse of a respective series is applied to the input side of a respective key in each key block, the output side of each key in each key block being connected to a respective common terminal, key input circuit means for multiplexing the outputs of said common terminals in sequential time frames, and read control circuit means connected to receive the output of said key input circuit means and said plurality of series of sequential timing pulses from said timing pulse generator means for generating actuating signals designating a key which has been actuated.

2. A key input circuit as defined in claim 1 wherein said read control circuit means includes a plurality of AND gates each receiving the output of said key input circuit means and a respective one of said series of timing pulses.

3. A key input circuit as defined in claim 2, further including memory means for storing representations of said actuating signals.

4. A key input circuit as defined in claim 3, further including encoder means connected between said read control circuit means and said memory means for converting said actuating signals to a binary combination of signals representing said actuating signals.

5. A key input circuit as defined in claim 3, further including encoder means connected to the output of said memory means for converting said stored representations of said actuating signals to a binary combination of signals.

6. A key input circuit comprising: timing pulse generator means for providing a plurality of sequential timing pulses in a repetitive time frame; a first group of key switches, one terminal of each of said key switches being connected to said timing pulse generator means so as to receive a respective timing pulse of said sequential timing pulses, the other terminals of said key switches being connected in common; a second group of key switches, one terminal of each of said second group of key switches being connected to said timing pulse generator means so as to receive a respective timing pulse of said sequential timing pulses, the other terminals of said second group of key switches being connected in common; key input circuit means connected to the commonly connected terminals of said first and second groups of key switches for providing a multiplexed pulse signal in which outputs of the commonly connected terminals of said first and second groups of key switches are multiplexed in sequential time frames; and read control circuit means including a group of AND gates, each of the AND gates receiving said multiplexed pulse signal as an input thereof and also receiving a respective one of said sequential timing pulses of said timing pulse generator means as another input thereof.

7. A key input circuit of claim 6, wherein said key input circuit means comprises a first and a second AND gate, said first AND gate receiving the output of the commonly connected terminals of said first group of key switches and a first series of control pulses, said second AND gate receiving the output of the commonly connected terminals of said second group of key switches and a second series of control pulses which is alternate in time with said first series of control pulses, said first and second control pulses having a duration substantially equal to said time frame, said key input circuit means further comprising an OR gate receiving outputs of said first and second AND gates and providing said multiplexed pulse signal.

8. A key input of claim 7, wherein said read control circuit means further comprises an additional AND gate which receives said multiplexed pulse signal, a selected one of said timing pulses of said timing pulse generator means and said second series of control pulses as inputs thereof.

9. In a key input circuit comprising a first, a second, a third and a fourth key switch each having a first and a second terminal, means for applying a first and a second timing pulse different in phase from each other to said first terminals of said first and second key switches, respectively, and to said first terminals of said third and fourth key switches, respectively, said second terminals of said first and second key switches being connected to a first common terminal and said second terminals of said third and fourth key switches being connected to a second common terminal, the improvement comprising key input means for multiplexing a first key signal and a second key signal appearing on said first and second common terminals, respectively, means for applying to said key input means a third and a fourth timing pulse different in phase from each other, each of said third and fourth timing pulses having pulse portions overlapping in time with that of said first and second timing pulses, but having a different pulse width therefrom, said key input means comprising means responsive to the logical products of said first and third, of said second and third, of said first and fourth and of said second and fourth timing pulses, respectively, to provide key signals at the output thereof corresponding to the key operation of said first, second, third and fourth key switches, respectively.

10. The improvement according to claim 9, wherein a first logical gate to which the output signal of said key input means and said first timing pulse are supplied at its inputs, second logical gate to which the output signal of said key input means and said second timing pulse are supplied as its inputs and, a third logical gate to which the output signals of said first and second logical gates and said third timing pulse are supplied as its inputs.

11. The improvement according to claim 10, comprising memory means for storing the outputs of said first, second and third logical gates.

12. The improvement according to claim 9, wherein each of said third and fourth timing pulses has a pulse duration equal in time to the pulse recurrence time of each of said first and second timing pulses.

* * * * *